United States Patent
Saha et al.

(10) Patent No.: US 6,248,664 B1
(45) Date of Patent: *Jun. 19, 2001

(54) METHOD OF FORMING A CONTACT

(75) Inventors: Naresh C. Saha, Chandler; Alan J. Magnus, Gilbert, both of AZ (US)

(73) Assignee: Semiconductor Components Industries LLC, Phoenix, AZ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/858,417

(22) Filed: May 19, 1997

(51) Int. Cl.$^7$ .................................................. H01L 21/44

(52) U.S. Cl. ........................ 438/652; 438/635; 438/624; 438/650

(58) Field of Search ........................... 438/787, 635, 438/652, 906, 650, 694, 624

(56) References Cited

U.S. PATENT DOCUMENTS

| | | | | |
|---|---|---|---|---|
| 3,649,884 | * | 3/1972 | Haneta | 317/235 R |
| 3,735,483 | * | 5/1973 | Sheldon | 438/113 |
| 3,896,473 | * | 7/1975 | DiLorenzo et al. | 357/15 |
| 4,294,651 | * | 10/1981 | Ohmura et al. | 156/662 |
| 4,374,012 | * | 2/1983 | Adlerstein | 204/192.25 |
| 4,534,099 | * | 8/1985 | Howe | 438/98 |
| 4,737,839 | | 4/1988 | Burt . | |
| 4,776,925 | * | 10/1988 | Fossum et al. | 438/297 |
| 5,508,543 | * | 4/1996 | Hartstein et al. | 257/314 |
| 5,622,896 | * | 4/1997 | Knotter et al. | 438/123 |
| 5,917,209 | * | 6/1999 | Andoh | 257/284 |

OTHER PUBLICATIONS

MSTIC Information Center: *Journal of the Electrochemical Society*; Jun. 1959; Chemical Etching of Silicon, 1. The System HF, $HNO_3$, and $H_2O$; Harry Robbins and Bertram Schwartz; pp. 505–509.

MSTIC Information Center, *Journal of the Electrochemical Society*, Feb. 1960; "Chemical Etching of Silicon, II. The System HF, and $HNO_3$, $H_2O$, and $HC_2H_3O_2$", H Robbins and B. Schwartz; pp. 108–111.

MSTIC Information Center, *J. Phys. Chem. Solids;* Jan. 1978; "Stain Films on Silicon"; R.J. Archer; Pergamon Press 1960, vol. 14, pp. 104–110 Printed in Great Britain.

MSTIC Information Center, J. Electrochem. Soc: *Solid–State Science and Technology*, "An Examination of the Chemical Staining of Silicon" D.G. Schimmel and M.J. Elkind; pp. 152–155.

Robert C. Weast "CRC Handbook of Chemistry and Physics", p. F90, Aug. 2, 1989.*

* cited by examiner

*Primary Examiner*—Stephen D. Meler
*Assistant Examiner*—Maria Guerrero
(74) *Attorney, Agent, or Firm*—Robert D. Atkins; Michael T. Wallace

(57) ABSTRACT

A dielectric layer (27) is formed between a semiconductor surface (24) and an electrical contact (26) to promote adhesion of the contact (26). The dielectric layer (27) is formed by cleaning operation followed by a chemical oxidation.

16 Claims, 1 Drawing Sheet

METHOD OF FORMING A CONTACT

BACKGROUND OF THE INVENTION

The present invention relates, in general, to semiconductors, and more particularly, to semiconductor processing techniques.

In the past, the semiconductor industry has formed electrical contacts on the backside of semiconductor wafers or semiconductor die. One technique for forming such contacts is to first grind the backside of the semiconductor wafer in order to thin or reduce the thickness of the semiconductor wafer. During the grinding operation active devices on the front side of the semiconductor wafer are covered by a protective tape for protection. After the grinding operation, the tape is removed. Thereafter, the back side of the semiconductor wafer is etched with hydrofluoric acid to prepare the surface for application of an electrical contact. A contact material is subsequently applied using successive depositions of titanium, nickel, and a gold-germanium alloy.

One problem with this method is contact peeling. Often, the contact does not adhere to the underlying semiconductor surface and the contacts often peel off the semiconductor surface. The peeling results in defective devices and increased manufacturing costs.

Accordingly, it is desirable to have a method of forming a contact that results in the contact adhering to the semiconductor surface.

DETAILED DESCRIPTION OF THE DRAWINGS

Figure 1:
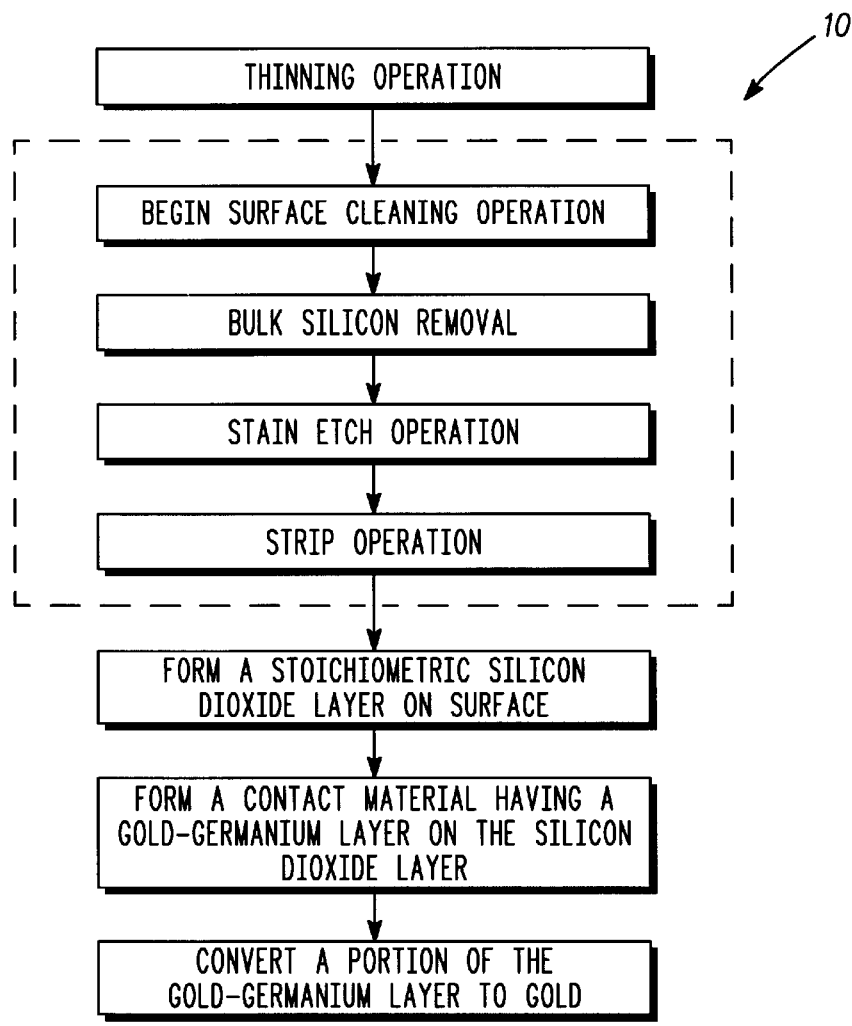
FIG. 1 is a flow chart illustrating some of the steps in a method of forming a contact on a semiconductor wafer according to the present invention.
Figure 2:
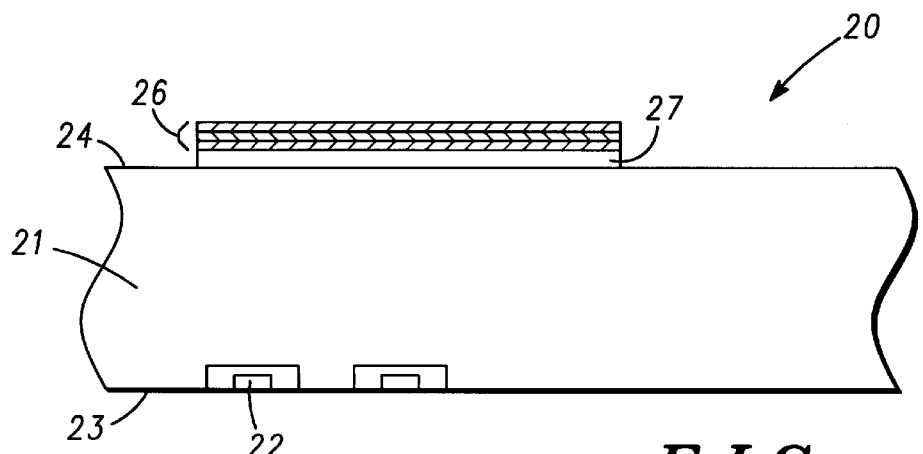
FIG. 2 is a cross-sectional portion of a semiconductor wafer according to the present invention.

The FIG. 1 is a flow chart 10 illustrating some of the steps in a method of forming a contact that adheres to a semiconductor wafer. FIG. 2 illustrates a cross-sectional view of a portion of a semiconductor wafer 20 processed by the method shown in FIG. 1. Wafer 20 includes a substrate 21 having a top or front surface 23 and a bottom surface or backside 24. Prior to the thinning operation shown in flow chart 10, semiconductor wafer 20 is processed to have active semiconductor devices 22 that are partitioned into semiconductor die on front surface 23. A protective tape (not shown) is applied to front surface 23 in order to protect devices 22. Thereafter, as shown in FIG. 1, a thinning operation is performed on backside 24 to reduce the thickness of wafer 20. Typically, the thinning operation is a grinding operation that is well known to those skilled in the semiconductor art.

Subsequently, a surface cleaning operation is utilized to prepare surface 24 for subsequent application of an electrical contact 26. The surface cleaning operation includes a bulk silicon removal step, a stain etch, and a strip operation. The bulk silicon removal step includes exposing surface 24 to a solution that includes nitric acid, hydrofluoric acid, and acetic acid. Typically the concentration is about 5:2:2, and the exposure time is about fifteen to fifty seconds and preferably is about thirty seconds. Both the exposure time and concentration can vary. This operation removes damage on surface 24 that results from the thinning operation. This bulk silicon removal generally removes less than about ten microns from surface 24.

After the bulk silicon removal operation, surface 24 has various oxides of silicon such as SiO, $SiO_2$, $SiO_3$, $Si_2O$, as well as $SiH_x$. Typically, these various combinations of materials form a dark surface and generally are referred to as a stain. This stain typically has to be removed in order to ensure adherence of contact materials that are to be later applied. Consequently, a stain etch operation is performed by exposing surface 24 to a solution that includes water, hydrogen peroxide, and ammonium fluoride in a 10:1:1 to 8:1:1 solution for about fifteen minutes. This stain etch removal operation can result in leaving some silicon oxide on the surface. Consequently, an oxide strip operation is performed by exposing surface 24 to a solution of ammonium fluoride and hydrogen fluoride in a 15:1 to 20:1 solution for about one to four, and preferably two, minutes.

Thereafter the protective tape is removed and a stoichiometric silicon dioxide layer 27 is formed on surface 24. Typically layer 27 covers all of surface 24, but may be limited to a portion thereof as shown in FIG. 2. Because semiconductor device 22 is formed on front surface 23, device 22 could be damaged if layer 27 were formed by evaporation or deposition techniques. Consequently, a chemical oxidation is utilized to form stoichiometric silicon dioxide layer 27. Surface 24 is first exposed to a water and hydrogen fluoride solution having a concentration of about 80:1 to 100:1 for approximately ten to ninety, and preferably thirty, seconds. Because the solution is dilute, it does not damage the front of semiconductor wafer 20. This solution removes any oxides that may have formed on surface 24 subsequent to the previous operations. The time and concentration can change as long as any oxides that may have formed on surface 24 are removed. Thereafter, an oxide growth step is performed by exposing surface 24 to a water, ammonium dihydrogen phosphate ($NH_4H_2PO_4$), and hydrogen peroxide solution with a concentration of about 8:1:1 to 10:1:1, respectively, for about one to ten minutes. This solution grows stoichiometric silicon dioxide layer 27 on surface 24. The thickness of layer 27 is limited to no greater than approximately one nanometer in order to minimize the resistance to current flow as will be seen hereinafter. The time and concentrations can change as long as layer 27 achieves the desired thickness.

Thereafter, contact 26 is formed on stoichiometric silicon dioxide layer 27 in order to form an electrical contact to the underlying semiconductor wafer. However, it is generally known in the art that silicon dioxide is an insulator, and an insulator is not used to form an electrical contact. Consequently, forming a dielectric such as stoichiometric silicon dioxide between a contact material and a semiconductor surface is contrary to the normal teachings of those skilled in the art and provides an unexpected result. Layer 27 assists in ensuring that subsequently formed contact 26 adheres to wafer 20, thereby lowering manufacturing cost. However, minimizing the thickness of layer 27 still provides a low resistance path for current flow.

Contact material is applied to stoichiometric silicon dioxide layer 27 by applying a layer of titanium, a layer of nickel, and a layer of a gold-germanium alloy utilizing techniques that are well known to those skilled in the art. Thereafter, a cap layer is formed on the contact by converting a portion of the gold-germanium alloy to gold. Forming this gold cap layer prevents oxidation of the gold-germanium alloy thereby facilitating forming good electrical contact between the contact and other external electrical devices. The cap layer is formed by immersing the semiconductor wafer or contact 26 in a solution containing de-ionized water, ammonium dihydrogen phosphate, and hydrogen peroxide in a concentration of about 93:5:2 to 70:20:10 and preferably 85:10:5 for approximately thirty seconds. This operation oxidizes a portion of the gold-germanium alloy to form germanium oxide and the germanium oxide dissolves in the solution leaving gold on the surface of the contact. The thickness of the gold cap layer typically is between seventy and eighty nanometers and is generally less than one hundred nanometers. This thickness assists in preventing oxidation of the underlying gold-germanium and in ensuring that a eutectic bond can be formed to the contact. Other materials could also be used instead of titanium including chromium, aluminum, and vanadium.

By now it should be appreciated that there has been provided a novel method of forming a contact on a semiconductor wafer. Utilizing a three step surface cleaning operation ensures that non-stoichiometric silicon oxides are removed from the surface of the wafer. Forming a stoichiometric silicon dioxide layer on the surface of the semiconductor wafer ensures that the contact material will adhere to the semiconductor wafer. Forming a gold cap on the contact material assists in ensuring that a eutectic bond can be formed to the contact.

What is claimed is:

1. A method of forming a contact comprising:
   forming a multilayer metal contact that provides electrical contact to a semiconductor substrate wherein the metal contact includes a titanium layer, a nickel layer, and a gold-germanium layer; and
   converting a portion of the gold-germanium layer to gold by removing germanium from the portion.

2. The method of claim 1 wherein removing germanium from the portion includes exposing the gold-germanium layer to a solution of ammonium dihydrogen phosphate, hydrogen peroxide, and water.

3. A method of forming a multilayered contact on a back surface of a semiconductor substrate, comprising:
   forming an active device on a front surface of the semiconductor substrate opposite to the back surface;
   forming an oxide layer on the back surface of the semiconductor substrate;
   forming the multilayered contact on the oxide layer wherein the multilayered contact includes a gold-germanium layer; and
   converting a portion of the gold-germanium layer to gold by removing germanium from the portion to provide the contact.

4. The method of claim 3 wherein the oxide layer includes a stoichiometric silicon dioxide material.

5. The method of claim 3 wherein the oxide layer substantially covers the back surface of the semiconductor substrate.

6. The method of claim 3 wherein the multilayered contact substantially covers the oxide layer.

7. The method of claim 3 wherein the multilayered contact includes a material from a group of aluminum, chromium, or vanadium.

8. The method of claim 3 wherein the multilayered contact further includes a titanium layer, and a nickel layer.

9. The method of claim 3 wherein the oxide layer is formed to a thickness to provide a low resistance path from the back surface of the semiconductor substrate to the the multilayered contact.

10. The method of claim 9 wherein the thickness of the oxide layer is less than one nanometer.

11. A method of forming a multilayered contact on a back surface of a semiconductor substrate, comprising:
    providing a substrate having a first surface opposite to a second surface;
    disposing an active semiconductor device on the first surface of the substrate;
    forming an oxide layer on the second surface of the substrate having a thickness providing a low resistance path from the second surface of the substrate to the multilayered contact;
    disposing the multilayered contact on the oxide layer, wherein the multilayered contact includes a gold-germanium layer; and
    converting a portion of the multilayered contact to gold by removing germanium from the gold-germanium layer to provide the contact.

12. The method of claim 11 wherein the oxide layer includes a stoichiometric silicon dioxide material.

13. The method of claim 11 wherein the oxide layer substantially covers the second surface of the substrate.

14. The method of claim 11 wherein the thickness of the oxide layer is less than one nanometer.

15. The method of claim 11 wherein the multilayered contact substantially covers the oxide layer.

16. The method of claim 11 wherein the multilayered contact includes a material from a group of aluminum, chromium, or vanadium.

* * * * *